United States Patent
Peng et al.

(10) Patent No.: US 9,337,306 B2
(45) Date of Patent: May 10, 2016

(54) MULTI-PHASE SOURCE/DRAIN/GATE SPACER-EPI FORMATION

(71) Applicant: GLOBALFOUNDRIES Inc., Grand Cayman (KY)

(72) Inventors: Jianwei Peng, Ballston Lake, NY (US); Xusheng Wu, Ballston Lake, NY (US); Hong Yu, Rexford, NY (US); Zhao Lun, Ballston Lake, NY (US)

(73) Assignee: GLOBALFOUNDRIES INC., Grand Cayman (KY)

( * ) Notice: Subject to any disclaimer, the term of this patent is extended or adjusted under 35 U.S.C. 154(b) by 163 days.

(21) Appl. No.: 14/319,462

(22) Filed: Jun. 30, 2014

(65) Prior Publication Data
US 2015/0380515 A1    Dec. 31, 2015

(51) Int. Cl.
H01L 21/336 (2006.01)
H01L 29/66 (2006.01)
H01L 29/78 (2006.01)
H01L 27/088 (2006.01)

(52) U.S. Cl.
CPC ........ H01L 29/6656 (2013.01); H01L 27/0886 (2013.01); H01L 29/66795 (2013.01); H01L 29/785 (2013.01)

(58) Field of Classification Search
None
See application file for complete search history.

(56) References Cited

U.S. PATENT DOCUMENTS

| 8,258,035 B2 | 9/2012 | Mathew et al. |
| 2013/0011975 A1 | 1/2013 | Cheng et al. |
| 2014/0134814 A1 | 5/2014 | Wong et al. |
| 2015/0380515 A1* | 12/2015 | Peng ............... H01L 29/6656 257/401 |
| 2016/0005656 A1* | 1/2016 | Ching ............ H01L 21/823431 438/283 |

* cited by examiner

*Primary Examiner* — Jack Chen
(74) *Attorney, Agent, or Firm* — Williams Morgan, P.C.

(57) ABSTRACT

Approaches for forming an epitaxial (epi) source/drain (S/D) and/or a semiconductor device having an epi S/D are provided. In embodiments of the invention, a first portion of the epi S/D is formed in the S/D region on a fin in a finned substrate. After the first portion is formed, but before completion of the formation of the S/D, a secondary spacer is formed in the S/D region. Then, the remainder portion of the S/D is formed in the S/D region. As a result, the S/D is separated from the gate stack by the secondary spacer.

16 Claims, 17 Drawing Sheets

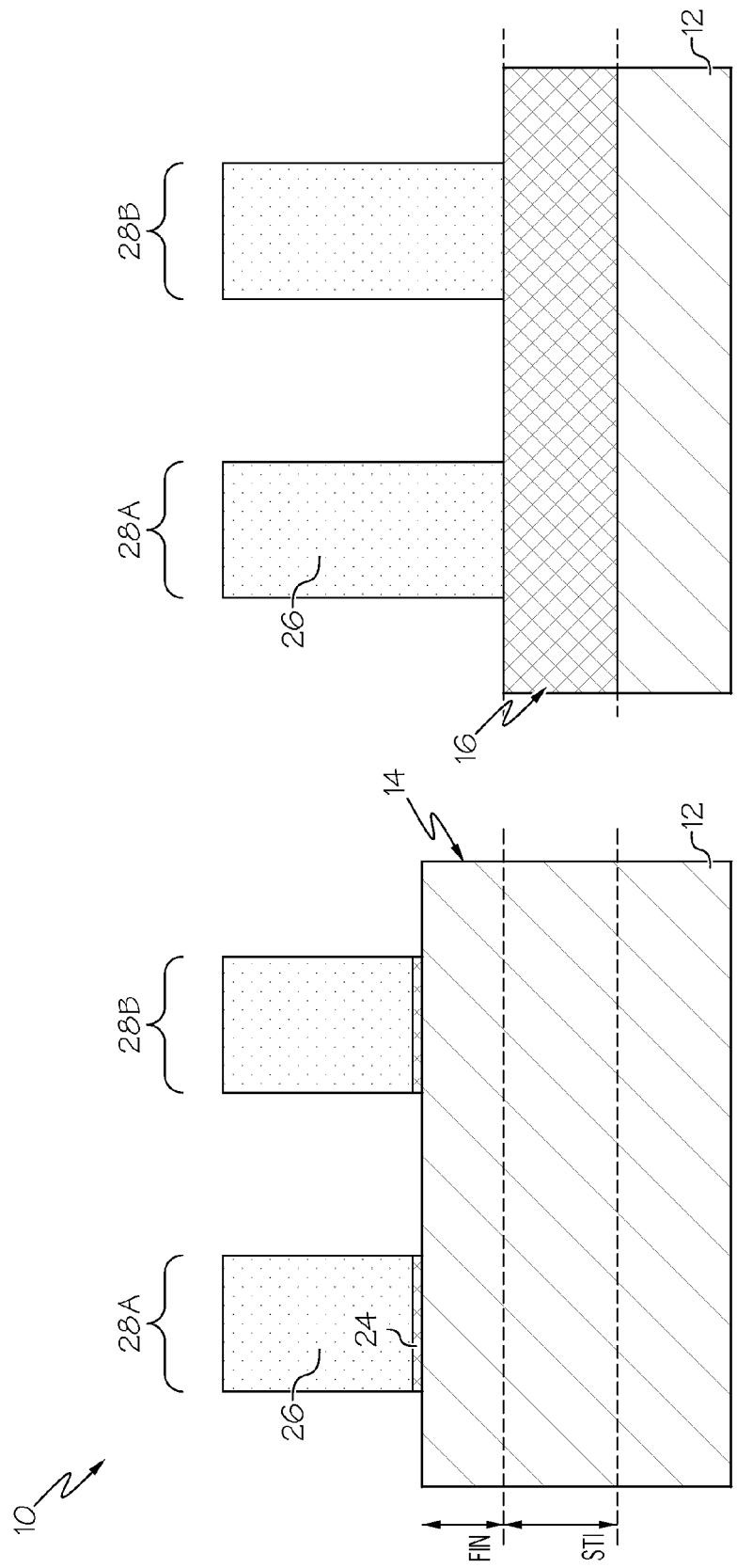

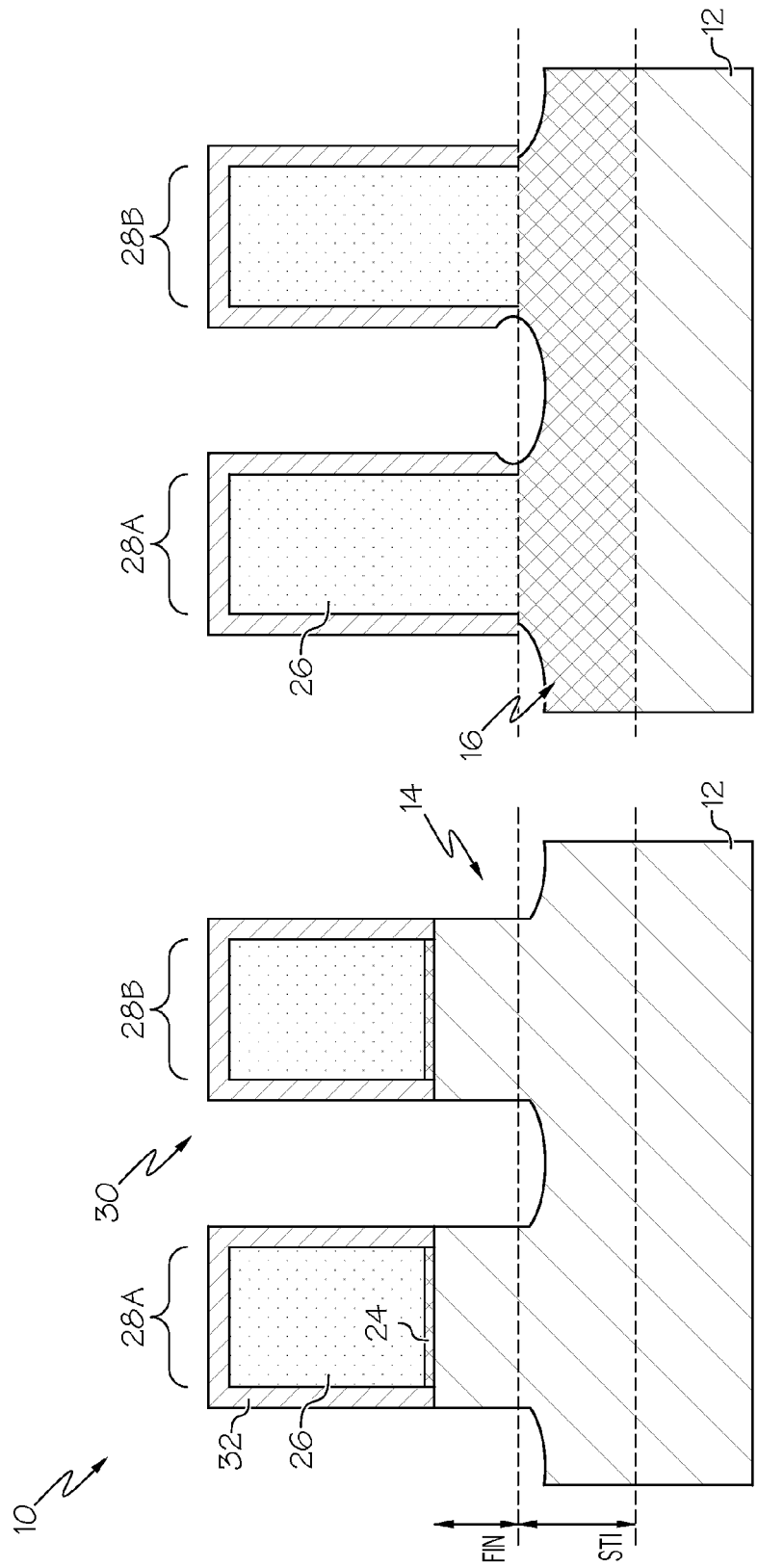

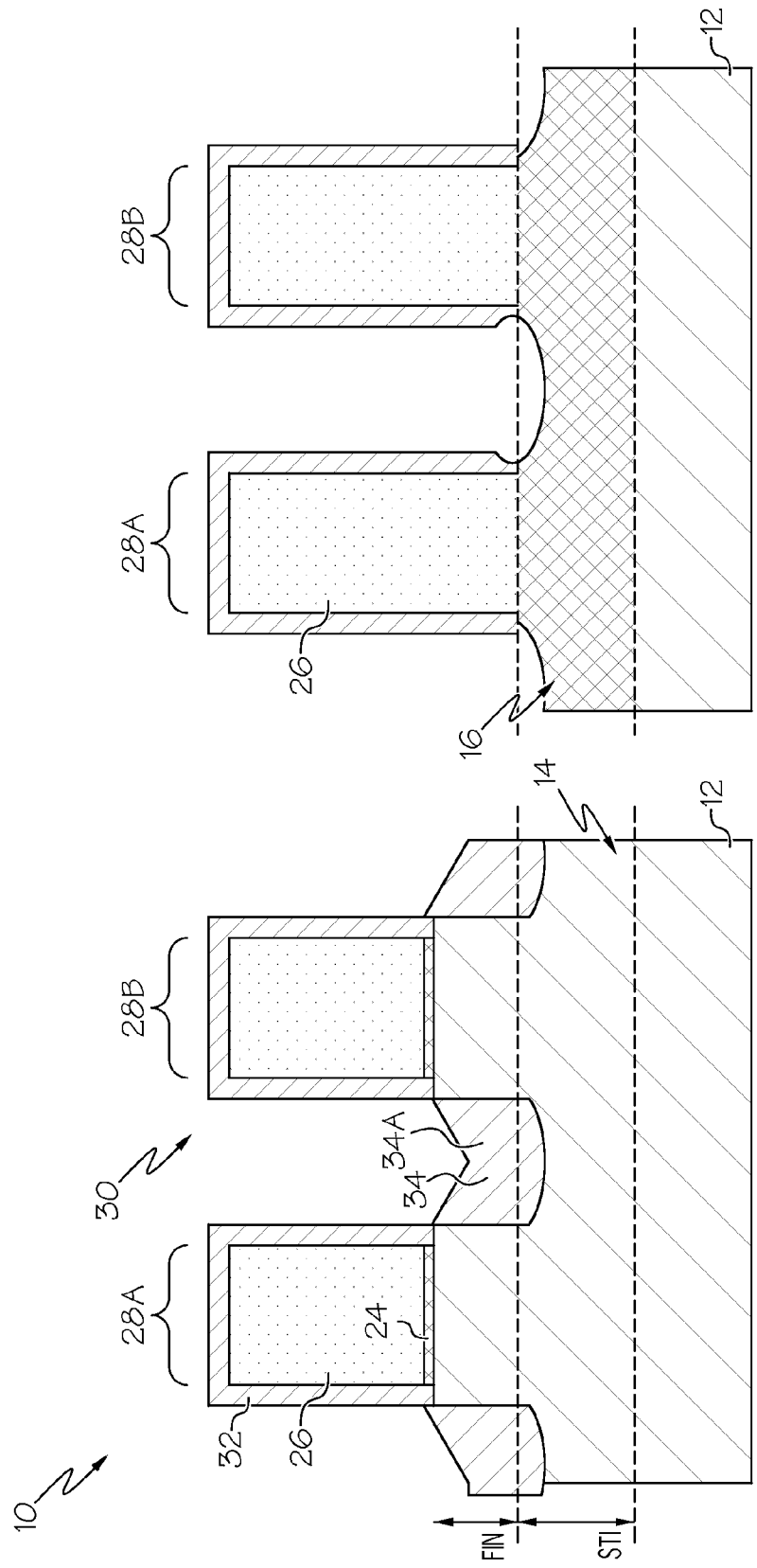

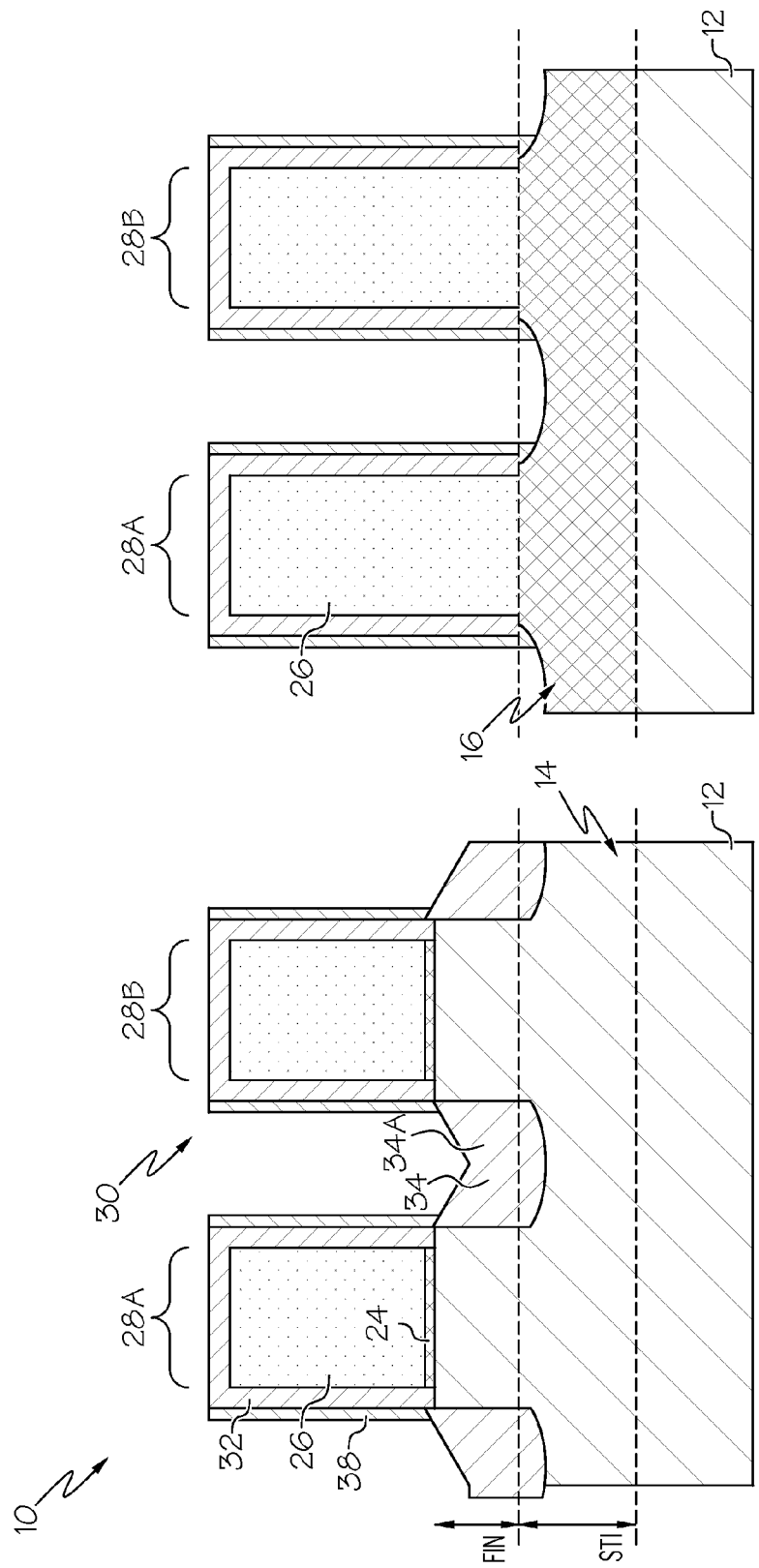

MULTI-PHASE SOURCE/DRAIN/GATE SPACER-EPI FORMATION

BACKGROUND

1. Technical Field

This invention relates generally to the field of semiconductors, and more particularly, to forming an Epitaxial (epi) Source/Drain (S/D) in a fin field effect transistor (FinFET) device.

2. Related Art

A typical integrated circuit (IC) chip includes a stack of several levels or sequentially formed layers of shapes. Each layer is stacked or overlaid on a prior layer and patterned to form the shapes that define devices (e.g., field effect transistors (FETs)) and connect the devices into circuits. In a typical state of the art complementary insulated gate FET process, such as what is normally referred to as CMOS, layers are formed on a wafer to form the devices on a surface of the wafer. Further, the surface may be the surface of a silicon layer on a silicon on insulator (SOI) wafer. A simple FET is formed by the intersection of two shapes, a gate layer rectangle on a silicon island formed from the silicon surface layer. Each of these layers of shapes, also known as mask levels or layers, may be created or printed optically through well-known photolithographic masking, developing, and level definition (e.g., etching, implanting, deposition, etc.).

The FinFET is a transistor design that attempts to overcome the issues of short-channel effect encountered by deep submicron transistors, such as drain-induced barrier lowering (DIBL). Such effects make it harder for the voltage on a gate electrode to deplete the channel underneath and stop the flow of carriers through the channel—in other words, to turn the transistor off. By raising the channel above the surface of the wafer instead of creating the channel just below the surface, it is possible to wrap the gate around all but one of its sides, providing much greater electrostatic control over the carriers within it.

In FinFET technology, both Epitaxial (epi) Source/Drain (S/D) and/or Replacement Metal Gate (RMG) techniques are commonly employed. Epitaxy involves the growth of a crystalline material (e.g., a S/D) on the crystal face of another material (e.g., a finned substrate), in such a manner that the crystalline substrates of both minerals have the same structural orientation. An epi S/D can help to reduce parasitic series resistance.

A replacement metal gate process refers to the formation of a temporary or "dummy" gate in a location where the gate is to be located. This dummy gate is removed after other formation processes have occurred and the gate is formed in the vacated location. This process can help to alleviate challenges that may be present in alternative gate-first integration processes.

SUMMARY

In general, approaches for forming an epitaxial (epi) source/drain (S/D) and/or a semiconductor device having an epi S/D are provided. In embodiments of the invention, a first portion of the epi S/D is formed in an S/D region on a fin in a finned substrate. After the first portion is formed, but before completion of the formation of the S/D, a secondary spacer is formed in the S/D region. Then, the remainder portion of the S/D is formed in the S/D region. As a result, the S/D is separated from the gate stack by the secondary spacer.

One aspect of the present invention includes a method for forming a device, the method comprising: forming a first portion of an epitaxial source/drain in a source/drain region on a fin in a finned substrate; forming, subsequent to the forming of the first portion of the source/drain, a secondary spacer in the source/drain region; and forming a remainder portion of the source/drain in the source/drain region, wherein the secondary spacer separates the source/drain from a gate stack region on the fin.

Another aspect of the present invention includes a method for forming an epitaxial source/drain in a fin-shaped field effect transistor (FinFET) device, the method comprising: etching a trench in a source/drain region of a fin of the FinFET device situated between a first gate stack region and a second gate stack region, each of the first gate stack region and the second gate stack region comprising a primary spacer along a vertical surface; forming a first portion of the source/drain in the trench on the fin; forming, subsequent to the forming of the first portion of the source/drain, a secondary spacer over the primary space on the vertical surface; removing the secondary spacer from over the first portion of the source/drain; and forming a remainder portion of the source/drain in a portion of the source/drain region adjacent to the secondary spacer.

Yet another aspect of the present invention includes a fin-shaped field effect transistor (FinFET) device, formed via a process, comprising: etching a trench in a source/drain region of a fin of the FinFET device situated between a first gate stack region and a second gate stack region, each of the first gate stack region and the second gate stack region comprising a primary spacer along a vertical surface; forming a first portion of source/drain in the trench on the fin; forming, subsequent to the forming of the first portion of the source/drain, a secondary spacer over the primary space on the vertical surface; removing the secondary spacer from over the first portion of the source/drain; and forming a remainder portion of the source/drain in a portion of the source/drain region adjacent to the secondary spacer.

BRIEF DESCRIPTION OF THE DRAWINGS

These and other features of this invention will be more readily understood from the following detailed description of the various aspects of the invention taken in conjunction with the accompanying drawings in which:

FIGS. 4A-D show a formation of a set of gate stacks in the FinFET semiconductor device of FIGS. 3A-C according to an embodiment of the present invention;

FIGS. 6A-C show a formation of the primary spacer and a formation of a trench in the source/drain region on the FinFET semiconductor device of FIGS. 5A-C according to an embodiment of the present invention;

FIGS. 7A-C show a formation of first portion of a source/drain on the FinFET semiconductor device of FIGS. 6A-C according to an embodiment of the present invention;

FIGS. 8A-C show a formation of a secondary spacer on the FinFET semiconductor device of FIG. 7A-C according to an embodiment of the present invention.

Figure 1A:
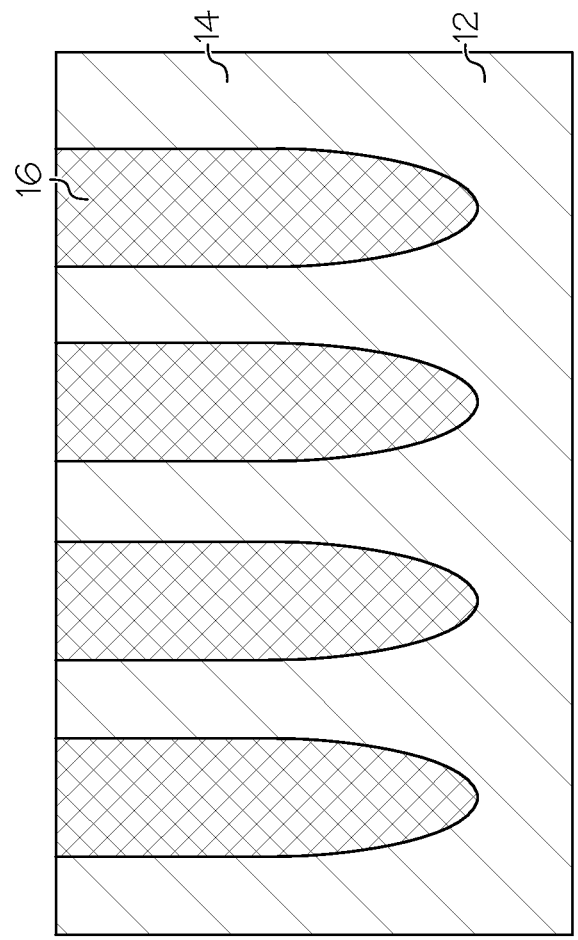
FIGS. 1A-B show multiple views of a FinFET semiconductor device according to an embodiment of the present invention.

The drawings are not necessarily to scale. The drawings are merely representations, not intended to portray specific parameters of the invention. The drawings are intended to depict only typical embodiments of the invention, and therefore should not be considered as limiting in scope. In the drawings, like numbering represents like elements.

DETAILED DESCRIPTION

Exemplary embodiments will now be described more fully herein with reference to the accompanying drawings, in which exemplary embodiments are shown. It will be appreciated that this disclosure may be embodied in many different forms and should not be construed as limited to the exemplary embodiments set forth herein. Rather, these exemplary embodiments are provided so that this disclosure will be thorough and complete and will fully convey the scope of this disclosure to those skilled in the art.

As mentioned above, approaches for forming an epitaxial (epi) source/drain (S/D) and/or a semiconductor device having an epi S/D are provided. In embodiments of the invention, a first portion of the epi S/D is formed in an S/D region on a fin in a finned substrate. After the first portion is formed, but before completion of the formation of the S/D, a secondary spacer is formed in the S/D region. Then, the remainder portion of the S/D is formed in the S/D region. As a result, the S/D is separated from the gate stack by the secondary spacer.

The terminology used herein is for the purpose of describing particular embodiments only and is not intended to be limiting of this disclosure. For example, as used herein, the singular forms "a", "an", and "the" are intended to include the plural forms as well, unless the context clearly indicates otherwise. Furthermore, the use of the terms "a", "an", etc., do not denote a limitation of quantity, but rather denote the presence of at least one of the referenced items. It will be further understood that the terms "comprises" and/or "comprising", or "includes" and/or "including", when used in this specification, specify the presence of stated features, regions, integers, steps, operations, elements, and/or components, but do not preclude the presence or addition of one or more other features, regions, integers, steps, operations, elements, components, and/or groups thereof.

Reference throughout this specification to "one embodiment," "an embodiment," "embodiments," "exemplary embodiments," or similar language means that a particular feature, structure, or characteristic described in connection with the embodiment is included in at least one embodiment of the present invention. Thus, appearances of the phrases "in one embodiment," "in an embodiment," "in embodiments" and similar language throughout this specification may, but do not necessarily, all refer to the same embodiment.

The terms "overlying" or "atop", "positioned on" or "positioned atop", "underlying", "beneath" or "below" mean that a first element, such as a first structure, e.g., a first layer, is present on a second element, such as a second structure, e.g. a second layer, wherein intervening elements, such as an interface structure, e.g. interface layer, may be present between the first element and the second element.

As used herein, "depositing" may include any now known or later developed techniques appropriate for the material to be deposited including but not limited to, for example: chemical vapor deposition (CVD), low-pressure CVD (LPCVD), plasma-enhanced CVD (PECVD), semi-atmosphere CVD (SACVD) and high density plasma CVD (HDPCVD), rapid thermal CVD (RTCVD), ultra-high vacuum CVD (UH-VCVD), limited reaction processing CVD (LRPCVD), metal-organic CVD (MOCVD), sputtering deposition, ion beam deposition, electron beam deposition, laser assisted deposition, thermal oxidation, thermal nitridation, spin-on methods, physical vapor deposition (PVD), atomic layer deposition (ALD), chemical oxidation, molecular beam epitaxy (MBE), plating, evaporation.

Figure 1B:
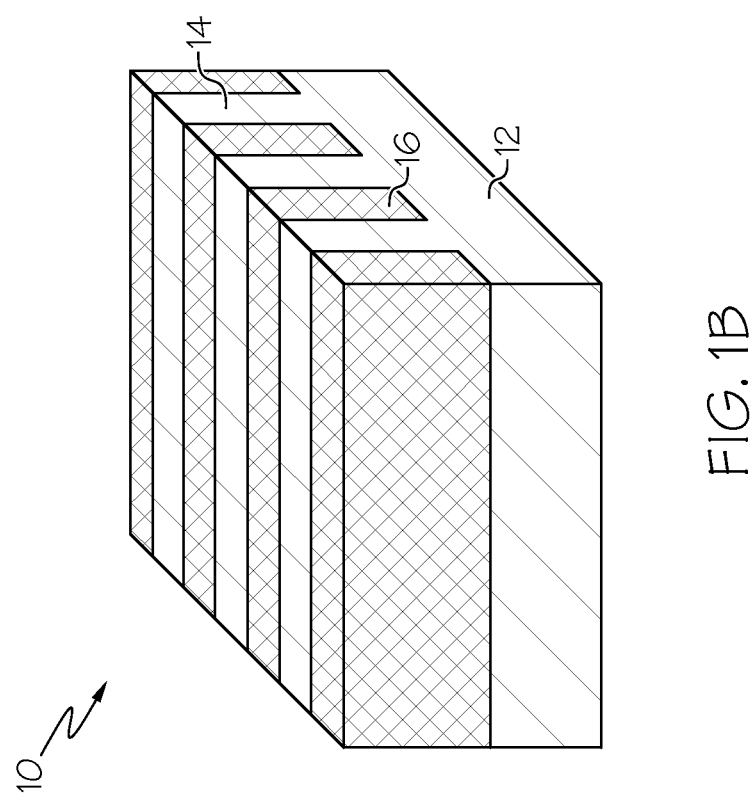

Referring now to FIGS. 1A-B, an initial formation stage of a semiconductor device 10 is shown. As depicted, the device 10 can be formed on a substrate 12 by forming a set of fins 14 from the substrate. To this extent, device 10 generally comprises a uniform, oxide-fin surface having a fin region 14 and an oxide fill 16. In general, the oxide-fin surface is formed by polishing (e.g., via CMP) oxide fill 16 to a top surface of fin region 14. This results in a substantially "planar" or "uniform" surface.

The term "substrate" 12 as used herein is intended to include a semiconductor substrate, a semiconductor epitaxial layer deposited or otherwise formed on a semiconductor substrate, and/or any other type of semiconductor body, and all such structures are contemplated as falling within the scope of the present invention. For example, the semiconductor substrate 12 may comprise a semiconductor wafer (e.g., silicon, SiGe, or an SOI wafer) or one or more die on a wafer, and any epitaxial layers or other type semiconductor layers formed thereover or associated therewith. A portion or entire semiconductor substrate 12 may be amorphous, polycrystalline, or single-crystalline. In addition to the aforementioned types of semiconductor substrates, the semiconductor substrate 12 employed in the present invention may also comprise a hybrid oriented (HOT) semiconductor substrate in which the HOT substrate has surface regions of different crystallographic orientation. The semiconductor substrate 12 may be doped, undoped, or contain doped regions and undoped regions therein. The semiconductor substrate 12 may contain regions with strain and regions without strain therein, or contain regions of tensile strain and compressive strain.

Figure 2B:
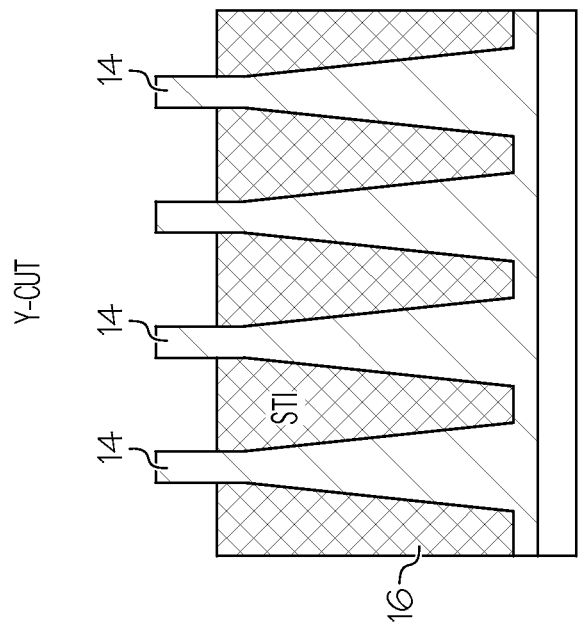
FIGS. 2A-B show a recessing of the oxide fill of the FinFET semiconductor device of FIGS. 1A-B according to an embodiment of the present invention.
Figure 2A:
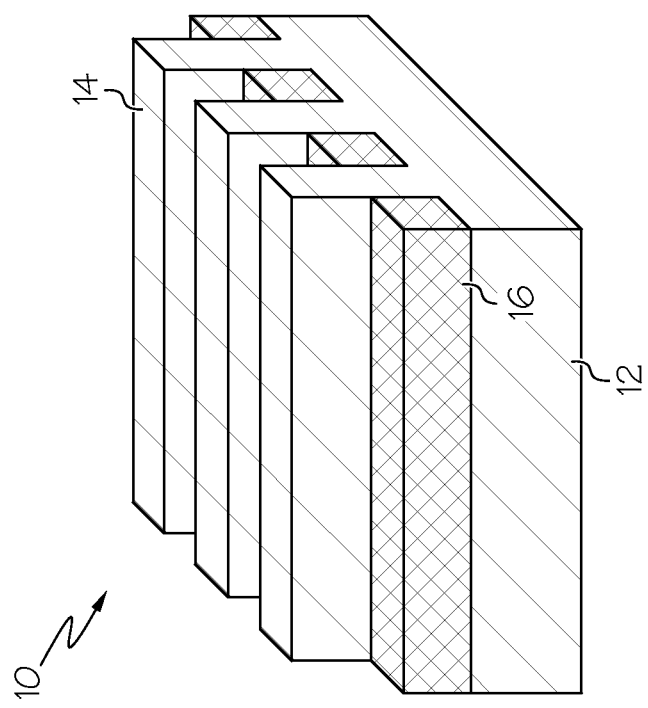
Figures 3A, 3B:
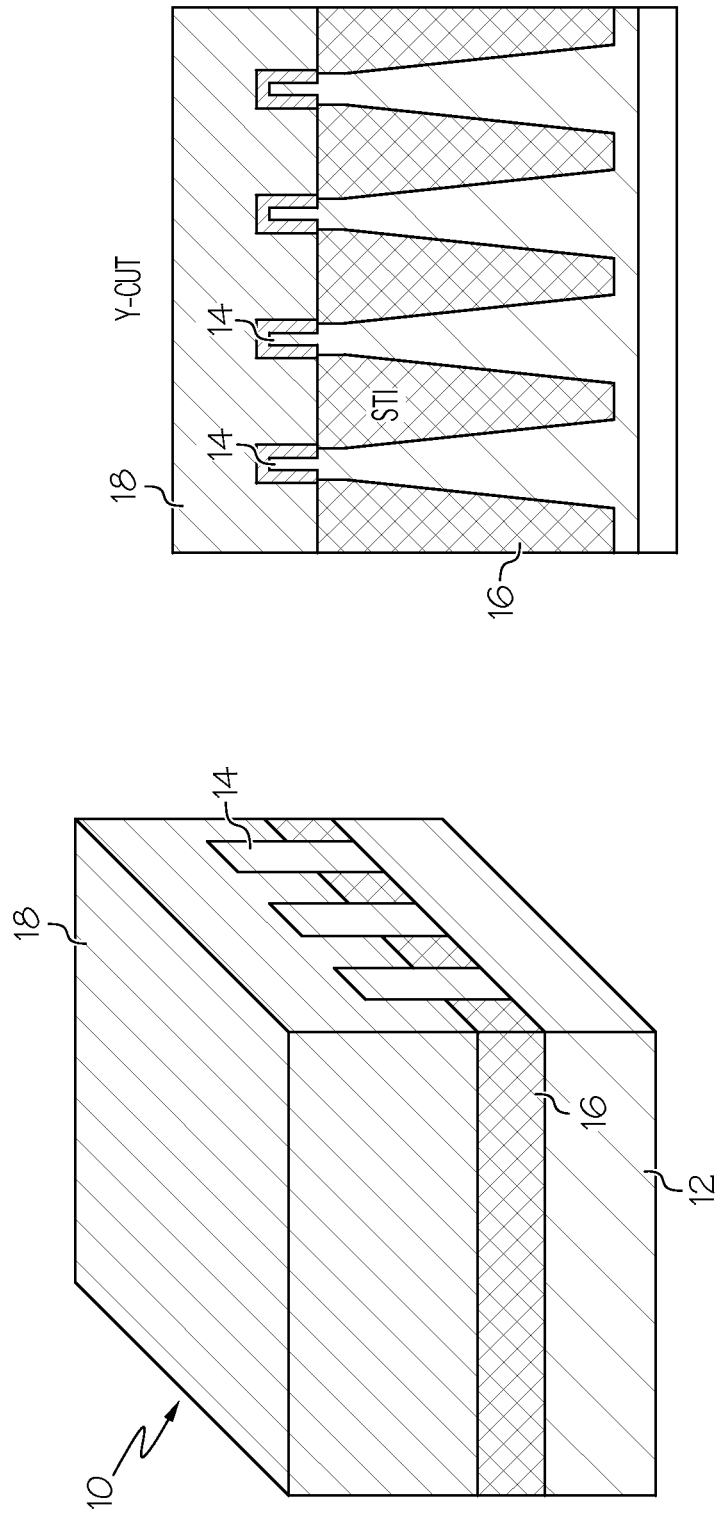
FIGS. 3A-C show a formation of an amorphous silicon layer in the FinFET semiconductor device of FIGS. 2A-B according to an embodiment of the present invention.
Figure 3C:
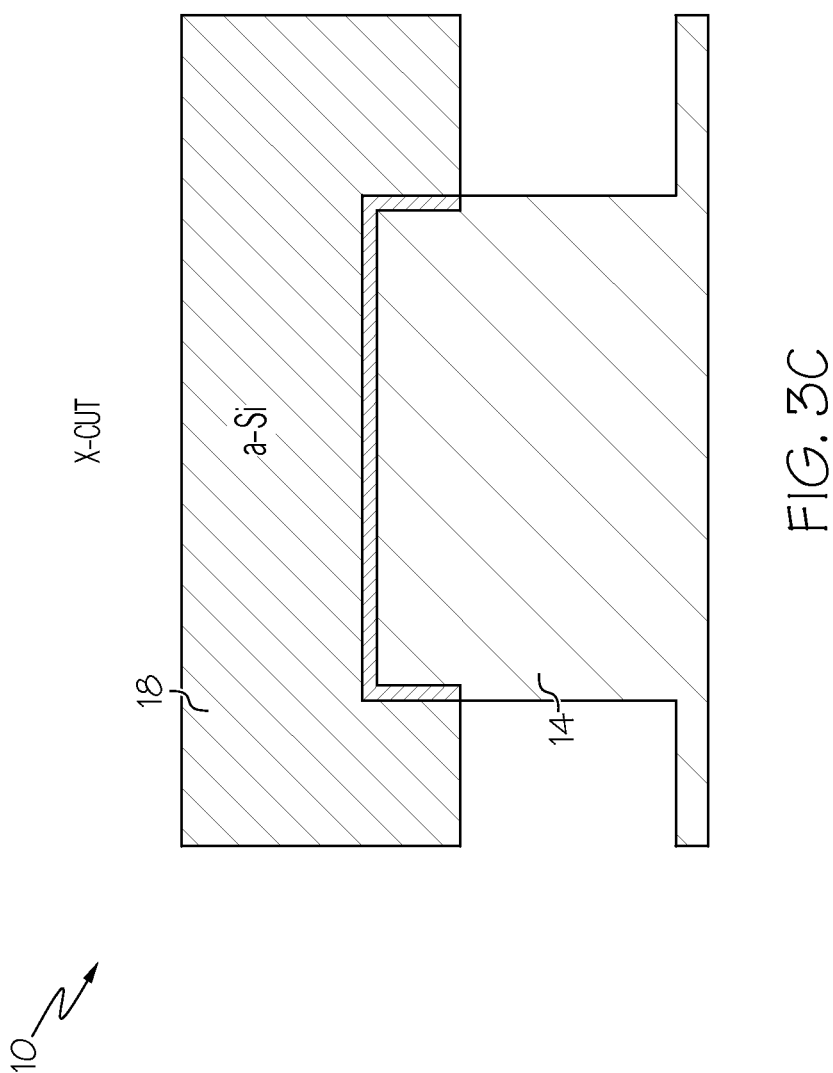

In any case, oxide fill 16 can then be recessed, as illustrated in FIGS. 2A-B, using any method. Then an amorphous silicon layer 18 can be formed, as illustrated in FIGS. 3A-C, using any method. Then, dummy gates 26 can be formed, such as by patterning amorphous silicon layer 18. As shown in FIG. 4C-D, semiconductor device 10 includes a first gate stack 28A and a second gate stack 28B, each of which includes a dummy gate 26, although this number should not be seen as limiting.

Figure 4B:
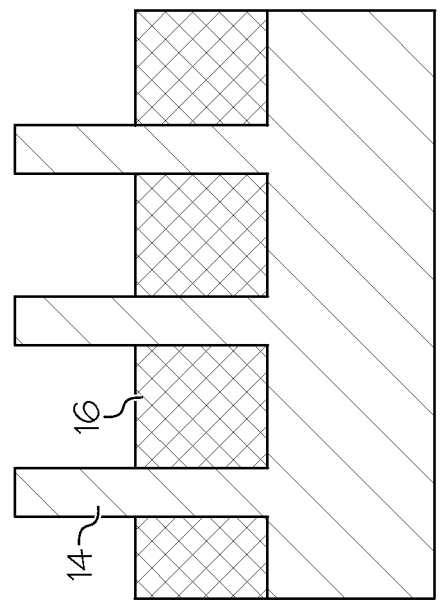
Figure 4A:
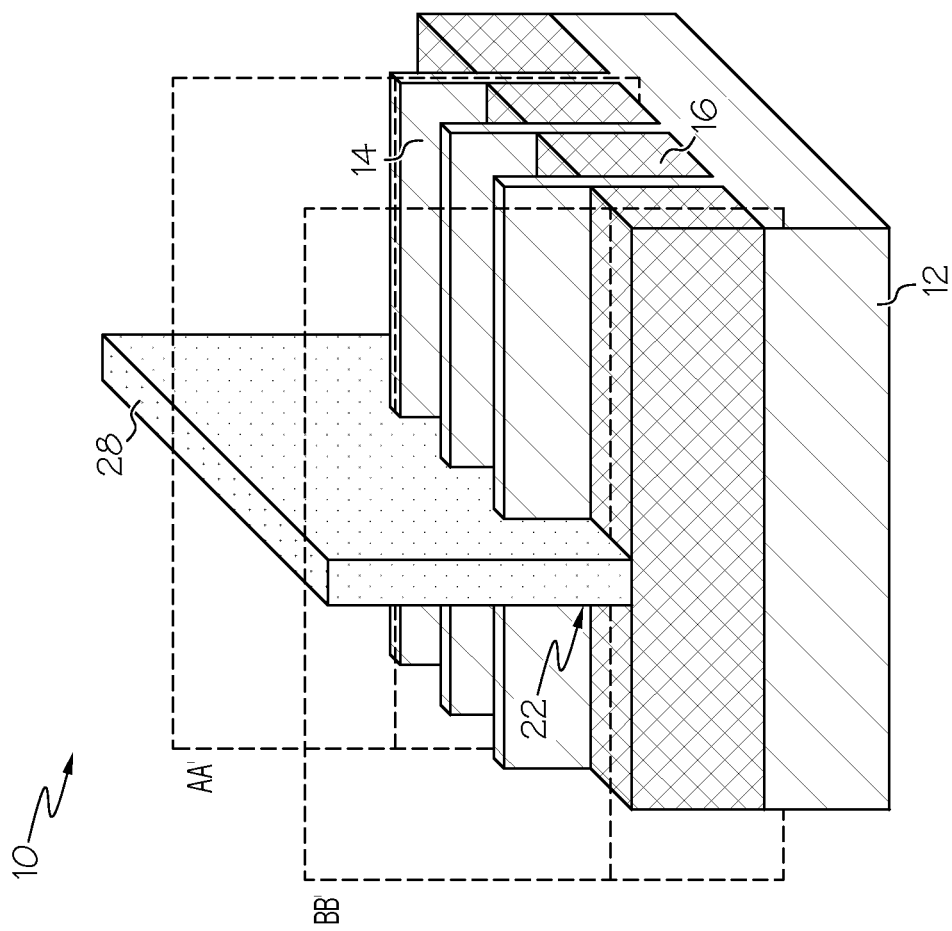

Referring now to FIGS. 4A-D a formation of a set of gate stacks 28 in the FinFET semiconductor device of FIGS. 3A-C is shown according to an embodiment of the present invention. FIG. 4A shows a perspective view while FIG. 4B shows a view along fins 14 of FinFET semiconductor device 10. As shown in FIG. 4C, a spacer 24 can be deposited on fins 14 using any method. Then, the material used to form gate stacks 28 can be deposited. This material can be deposited in such a way that the material flows into the recessed regions containing oxide fill 16. The top of the gate stack can then be made relatively level by CMP process or other similar technique. This results in a first gate stack 28A and a second gate stack 28B having an amount of gate stack 28 material that is greater along an oxide fill axis BB', as shown in FIGS. 4A and 4D than along a fin axis AA', as shown in FIGS. 4A and 4C.

Figure 5A:
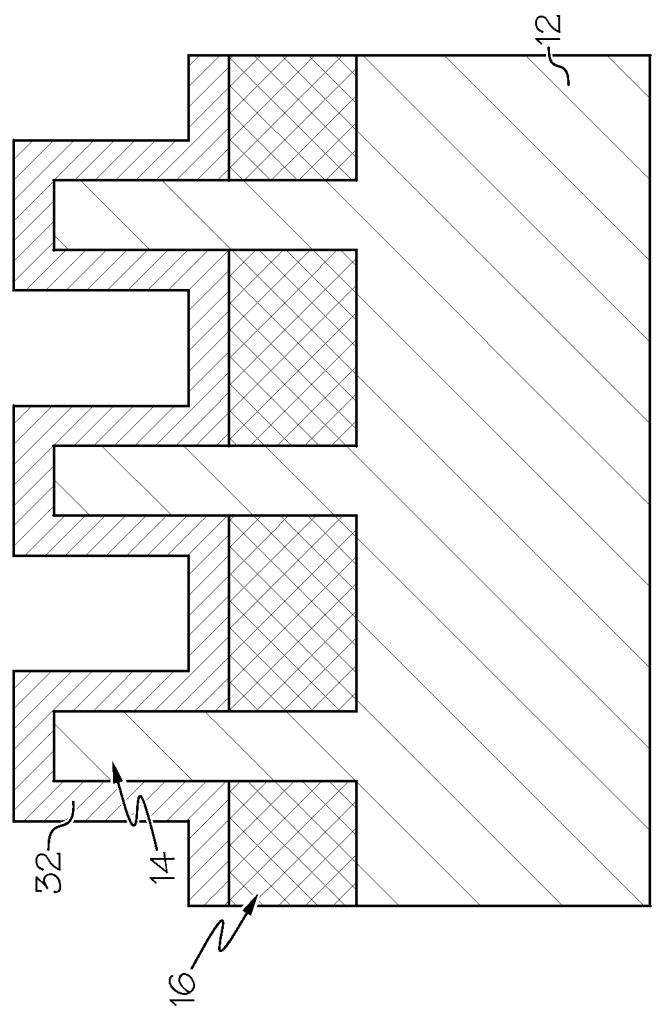
FIGS. 5A-C show a formation of a primary spacer on the FinFET semiconductor device of FIGS. 4A-D according to an embodiment of the present invention.
Figures 5B, 5C:
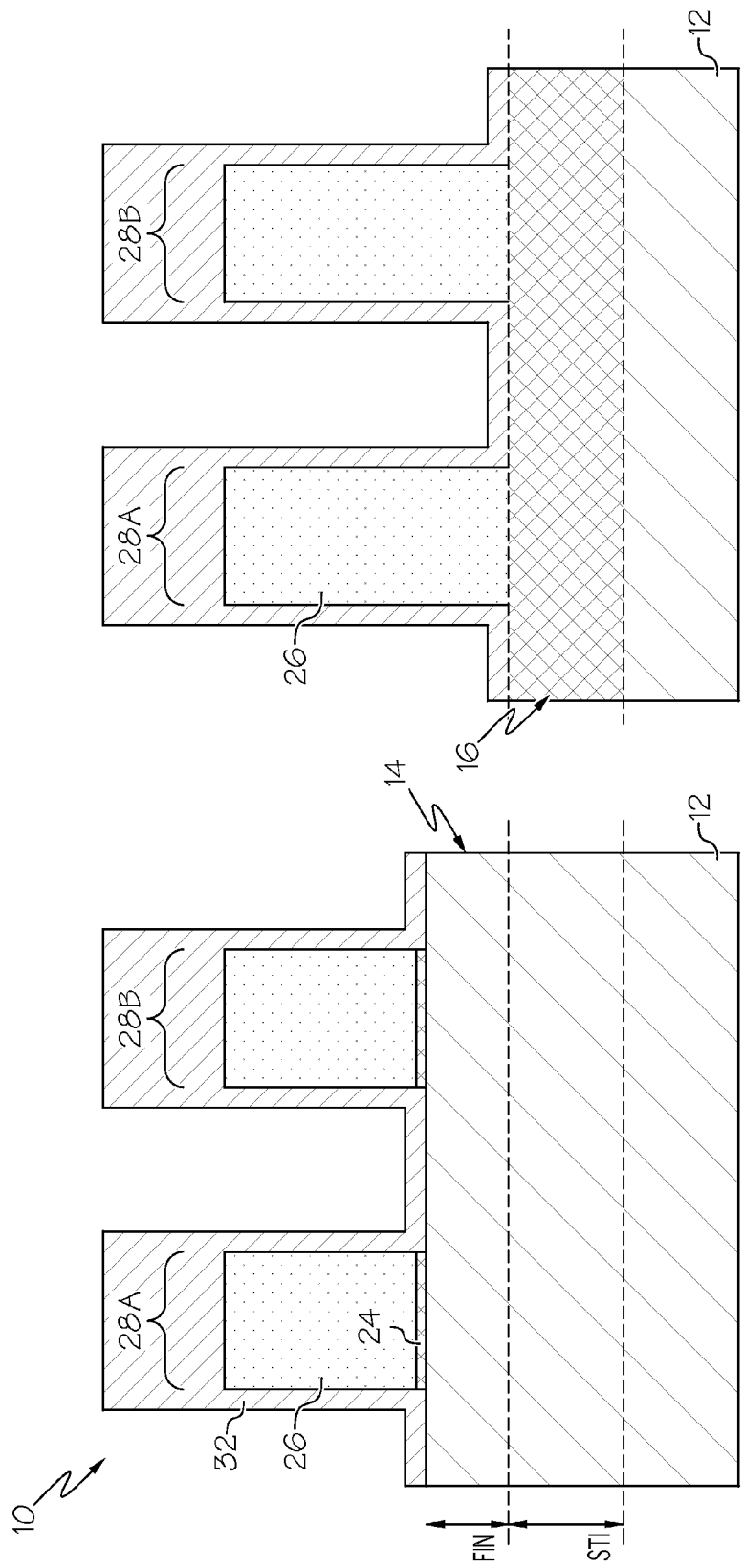

Referring now to FIGS. 5A-C, primary spacer 32 is formed in the FinFET semiconductor device 10 of FIGS. 4A-D according to an embodiment of the present invention. FIG. 5A shows a view along fins 14 of FinFET semiconductor device 10, FIG. 5B shows a view along fin axis AA' (FIG. 4A), and FIG. 5C shows a view along oxide fill axis BB' (FIG. 4A). As shown in FIG. 5A, primary spacer 32 is formed over fins 14 and oxide fill 16 in portions of FinFET semiconductor device 10 (not labeled in figure) where a gate stack 28 is not present. Further, as shown in FIGS. 5B and 5C, primary spacer 32 is formed adjacent to dummy 26 and adheres to both a top surface and sides of dummy gate 26 in each of the gate stacks 28A-B. Primary spacer 32 can be formed with a reactive ion etch or in any other manner now known or later developed. In embodiments of the invention, primary spacer 32 comprises a material that has low risk of exposure EPI materials (typically TMAH or NH4OH) used to remove poly gate materials.

Figure 6A:
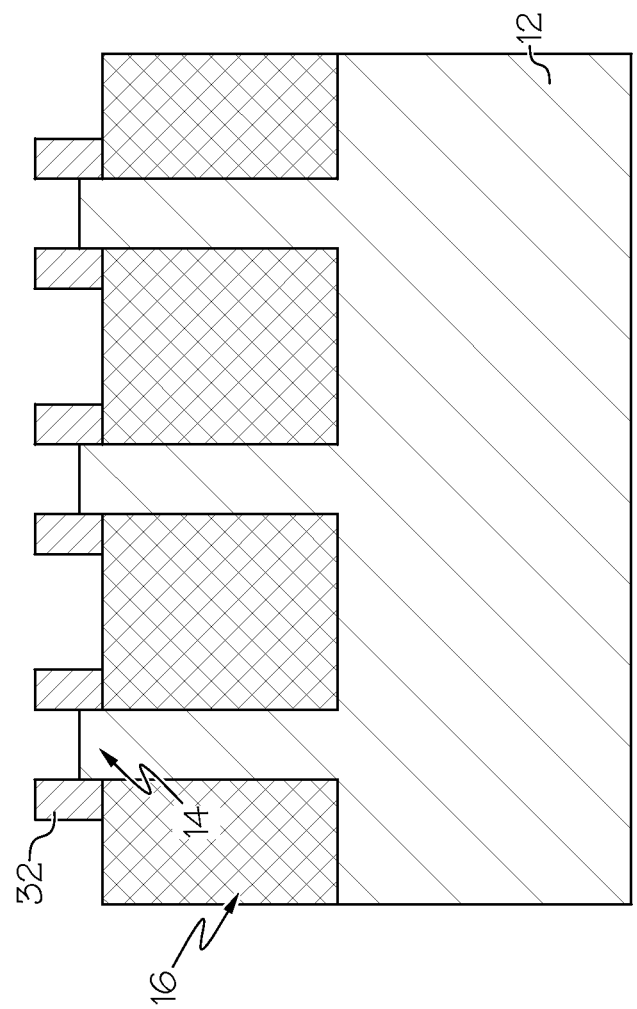

Then, as shown in FIGS. 6A-C, primary spacer 32 is etched and a trench 30 is formed in the source/drain region (e.g., between first gate stack 28A and second gate stack 28B) on the FinFET semiconductor device 10 of FIGS. 5A-C according to an embodiment of the present invention. FIG. 6A shows a view along fins 14 of FinFET semiconductor device 10, FIG. 6B shows a view along fin axis AA' (FIG. 4A), and FIG. 6C shows a view along oxide fill axis BB' (FIG. 4A). As shown, polishing removes primary spacer 32 from over horizontal surfaces of FinFET semiconductor device 10 (e.g., over first gate stack 28A and second gate stack 28B). Then, trench 30 may be fabricated using any suitable process, which could include one or more photolithography and/or etch processes. The photolithography process may include forming a photoresist layer (not shown) overlying substrate 20 (e.g., on a silicon layer), exposing the resist to a pattern, performing post-exposure bake processes, and developing the resist to form a masking element including the resist. The masking element may then be used to etch each trench 22 into the source/drain region, e.g., using reactive ion etch (RIE) and/or other suitable processes.

Figure 7A:
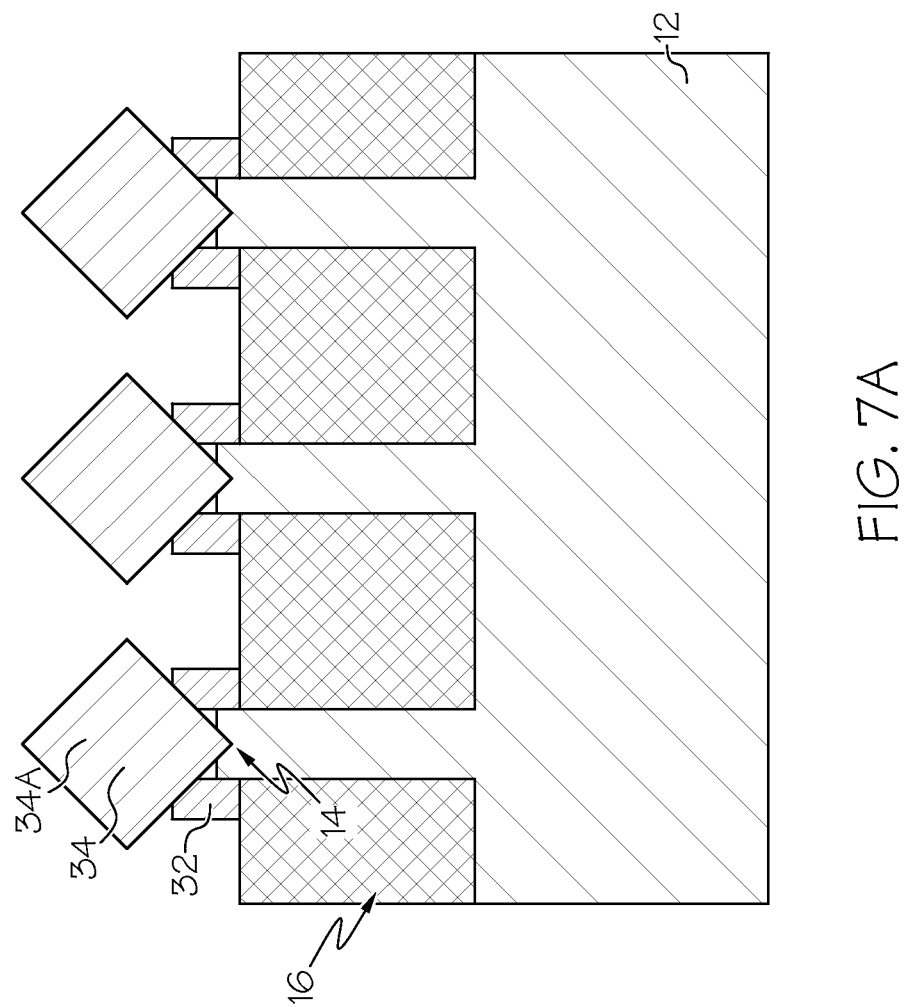

Referring now to FIG. 7A-C, a creation of an epitaxial (epi) S/D 34 on the FinFET semiconductor device 10 of FIGS. 6A-C according to an embodiment of the present invention is shown. FIG. 7A shows a view along fins 14 of FinFET semiconductor device 10, FIG. 7B shows a view along fin axis AA' (FIG. 4A), and FIG. 7C shows a view along oxide fill axis BB' (FIG. 4A). In current solutions, S/D 34 is usually formed as one epitaxial growth. Due to the curved (U-shaped) nature of the trench bottom, this can result in the formation of wing-like (V-shaped) structures 36 at the upper part of the S/D 34.

The inventors of this invention have discovered deficiencies in the current solutions. For example, the inventors have discovered that EPI materials tend to merge or come close to merging with S/Ds on neighboring fins due to narrow space. This (near) merging can lead to spaces into which subsequently deposited fill materials cannot penetrate, leading to holes below the (near) merged EPI materials. The EPI materials adjacent to such holes can have a high risk of exposure to poly gate removal materials, typically TMAH or NH4OH, which can lead to gate to S/D short. In addition, the inventors have discovered that there is a spacer thickness tradeoff between device performance and gate capacitance. A thinner spacer may be needed to improve device performance while a thicker spacer may be needed to reduce gate capacitance. Still further, the V-shaped wings 36 can result in high gate capacitance at a given height of the center point required for TS process.

Referring again to FIGS. 7A-C, the current invention forms the epi S/D 34 in a multi-stage process. This begins with the formation of a first portion 34A of the epi S/D 34 in the region between the gate stacks 28A-B (e.g., the S/D region) on a fin 14 of the FinFET semiconductor device. This formation of first portion 34A of the S/D further includes growing a first epitaxial layer on the fin 14 to a pre-determined intermediate size. To this extent, first portion 34A can fill the U-shaped bottom of trench 30 (FIG. 6) and occupy some percentage of the area filled by a current-solution single growth epi S/D. However, some portion of the epi S/D that would have been filled in a current-solution single growth epi S/D remains unfilled, as the first portion 34A does not represent the final size of epi S/D 34. First portion 34A can be formed using silicon phosphide, silicon germanium, and/or any other substance now known or later developed for forming epitaxial source/drains.

Figure 8A:
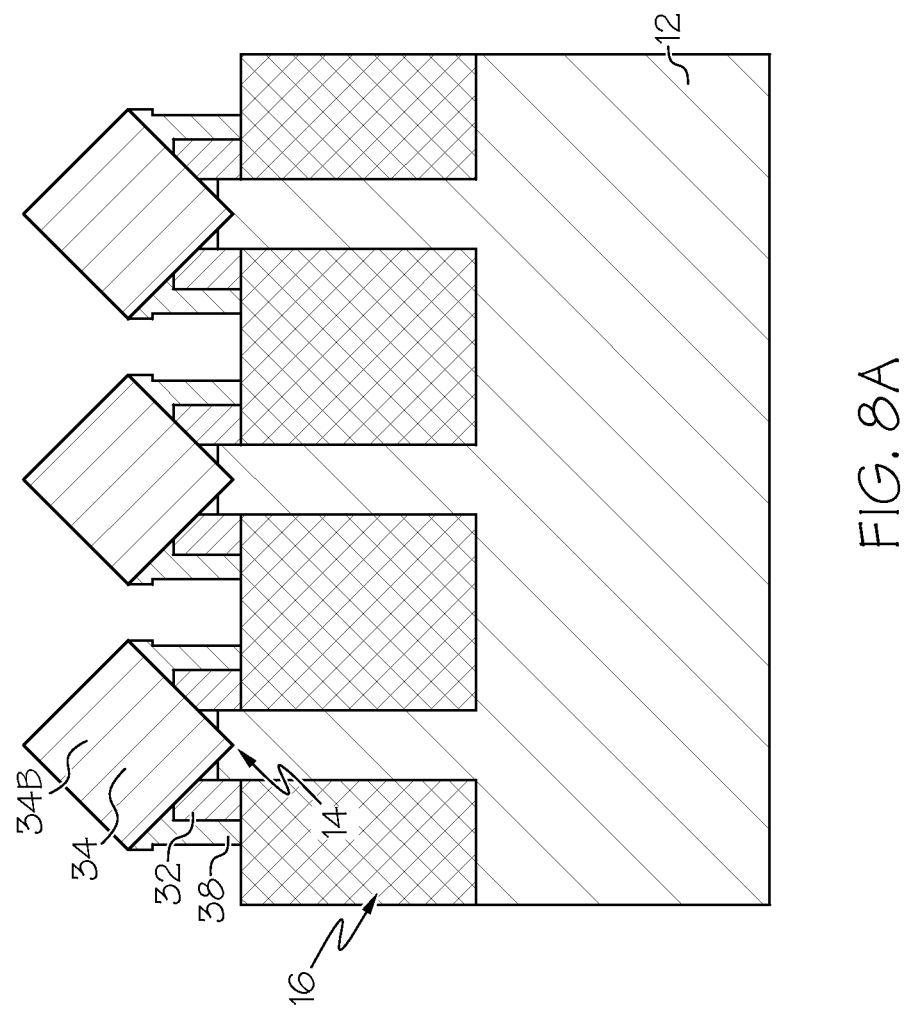

A secondary spacer 38 is subsequently formed on the first portion 34A of the FinFET semiconductor device 10 of FIGS. 7A-C, as shown in FIGS. 8A-C according to an embodiment of the present invention. FIG. 8A shows a view along fins 14 of FinFET semiconductor device 10, FIG. 8B shows a view along fin axis AA' (FIG. 4A), and FIG. 8C shows a view along oxide fill axis BB' (FIG. 4A). Secondary spacer 38 can comprise a material that is substantially identical to the material forming primary spacer 32 or, alternatively, can comprise a material that is different from that of primary spacer 32. Secondary spacer 38 can be formed with a reactive ion etch or in any other manner now known or later developed. What results is secondary spacer 38 over primary spacer 32 on the vertical surface of gate stacks 28A-B in the source/drain region as shown in FIGS. 8A-C. Further, secondary spacer 38 is formed on the portion of the vertical surface of first portion 34 of epi S/D adjacent to oxide fill 16 as illustrated in FIGS. 8A. This portion of secondary spacer 38 can act as a buffer/barrier between individual ones of the epi S/Ds 34 located on adjacent fins 14. Secondary spacer 38 can then be polished to remove any portion of secondary spacer 38 that may remain on the horizontal surfaces of gate stacks 28A-B, epi S/D 34, etc.

Figure 9A:
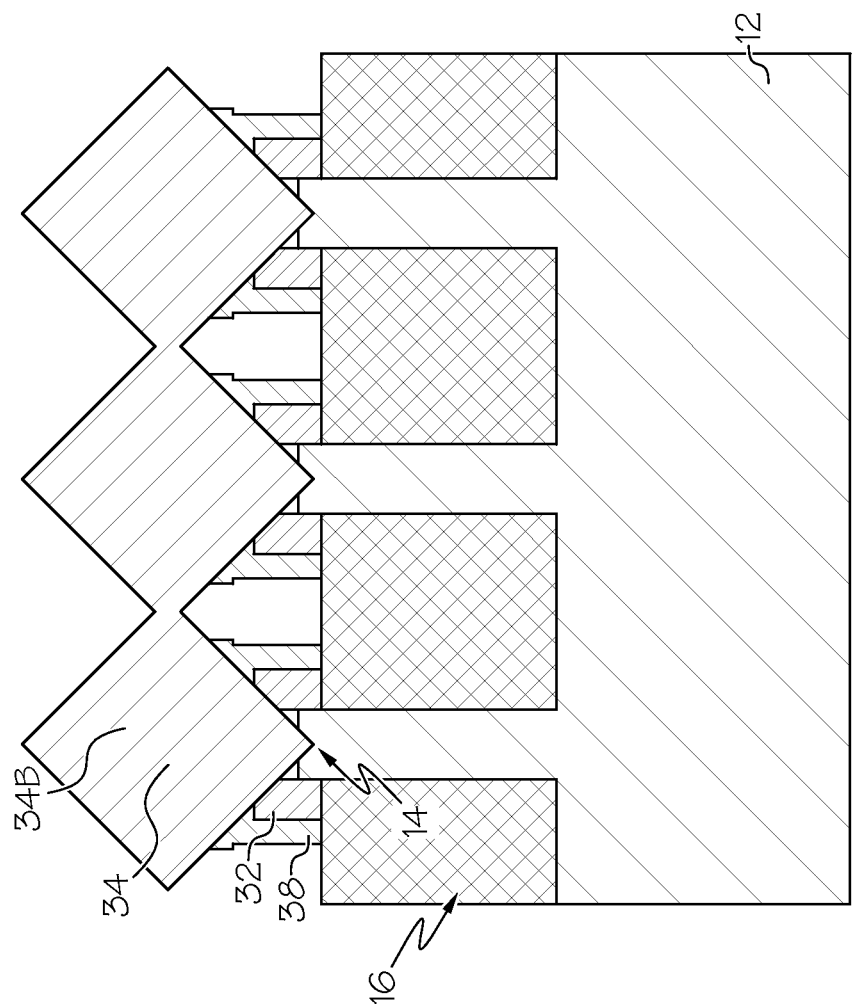
FIGS. 9A-C show a formation of a remainder portion of the source/drain on the FinFET semiconductor device of FIG. 8 according to an embodiment of the present invention.
Figures 9B, 9C:
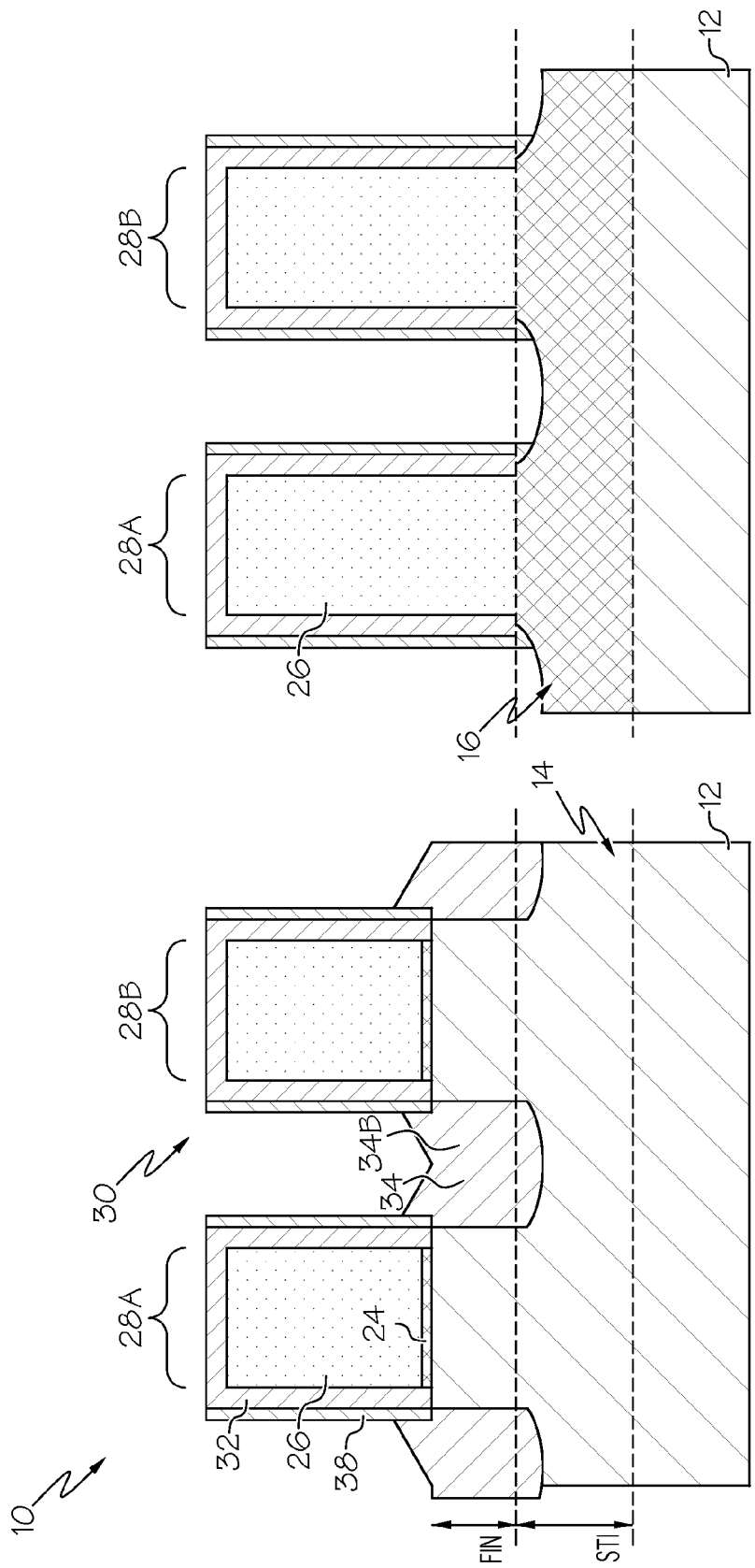

Referring now to FIGS. 9A-C a formation of a remainder portion 34B of the source/drain 34 in the source/drain region of the FinFET semiconductor device 10 of FIGS. 8A-C according to an embodiment of the present invention is shown. FIG. 9A shows a view along fins 14 of FinFET semiconductor device 10, FIG. 9B shows a view along fin axis AA' (FIG. 4A), and FIG. 9C shows a view along oxide fill axis BB' (FIG. 4A). Remainder portion 34B can be formed by growing a second epitaxial layer on the first epitaxial layer (e.g., first portion 34A) to a final size. This results in a fully formed S/D 34 on a fin of FinFET semiconductor device 10. Remainder portion 34B can be formed using a substance (e.g., SiP, SiGe, and/or the like) that is substantially the same as that which was used to form first portion 34A or, alternatively, a different substance can be used. In any case, remainder portion 34B can be formed using an epitaxial process that results in a crystalline structure in remainder portion 34B that results in remainder portion 34B having the same structural orientation as first portion 34A.

Thus, S/D 34 formed by the multi-stage process of the claimed invention is functionally equivalent to similar source/drains formed in single-stage processes. However, the presence of secondary spacer 38 between S/D 34 and gate stacks 28A-B (FIG. 9B, 9C) reduces or substantially eliminates any parasitic capacitance between S/D 34 and the gate and also reduces the risk of shortage between S/D 34 and the gate. Further, because remainder portion 34B is formed on a relatively flat surface (FIG. 9B, 9C) formed by the etch of the first portion 34A (as opposed to the U-shaped surface formed by the initial etch), the V-shaped wings 36 (FIG. 7B) of the single stage S/D will be reduced or substantially eliminated, resulting in reduced gate capacitance and/or better contact formation. Still further, the presence of secondary spacer 38 (FIG. 9A) on the portion of the vertical surface of S/D 34 adjacent to oxide fill 16 restricts growth of remainder portion 34B in the direction of adjacent S/Ds 34, reducing or substantially eliminating the instances of adjacent S/Ds 34 (e.g., S/Ds on adjacent fins 14) merging and resulting in vulnerable holes beneath the merged S/Ds 34.

It is apparent that there has been provided methods for forming an epi S/D in an S/D region in a FinFET device using a multi-phase process. While the invention has been particularly shown and described in conjunction with exemplary embodiments, it will be appreciated that variations and modifications will occur to those skilled in the art. For example, although the illustrative embodiments are described herein as a series of acts or events, it will be appreciated that the present invention is not limited by the illustrated ordering of such acts or events unless specifically stated. Some acts may occur in different orders and/or concurrently with other acts or events apart from those illustrated and/or described herein, in accordance with the invention. In addition, not all illustrated steps may be required to implement a methodology in accordance with the present invention. Furthermore, the methods according to the present invention may be implemented in association with the formation and/or processing of structures illustrated and described herein as well as in association with other structures not illustrated. Therefore, it is to be understood that the appended claims are intended to cover all such modifications and changes that fall within the true spirit of the invention.

What is claimed is:

1. A method for forming a device, the method comprising:
   epitaxially growing a first portion of a source/drain in a source/drain region on a fin in a finned substrate;
   forming, subsequent to the epitaxially growing of the first portion of the epitaxial source/drain, a secondary spacer in the source/drain region; and
   forming a remainder portion of the epitaxial source/drain in the source/drain region,
   wherein the secondary spacer separates the epitaxial source/drain from a gate stack region on the fin.

2. The method according to claim 1, further comprising forming, a set of fins from a substrate to form the finned substrate.

3. The method according to claim 1, further comprising:
   forming, prior to the epitaxially growing of the first portion of the epitaxial source/drain, a first gate stack region and a second gate stack region on the finned substrate.

4. The method according to claim 3, the forming of the first and second gate stack regions further comprising:
   forming a dummy gate on the finned substrate in each of the first gate stack region and the second gate stack region; and
   forming a primary spacer on a vertical surface of each dummy gate,
   wherein the source/drain region is between the first gate stack region and the second gate stack region, and
   wherein the secondary spacer is formed over the primary spacer on the vertical surface of each dummy gate.

5. The method according to claim 4, wherein the secondary spacer restricts a growth of the epitaxial source/drain in a direction of an adjacent source/drain.

6. The method according to claim 4, wherein the secondary spacer comprises a material that is different from a material of the primary spacer.

7. The method according to claim 1,
   wherein the epitaxially growing of the first portion of the epitaxial source/drain further comprises growing a first epitaxial layer on the fin to a pre-determined intermediate size; and
   wherein the forming of the remainder portion of the epitaxial source/drain further comprises growing a second epitaxial layer on the first epitaxial layer to a final size.

8. The method according to claim 1, further comprising:
   etching, prior to the epitaxially growing of the first portion of the epitaxial source/drain, a trench in the source/drain region; and
   etching, subsequent to the forming of the secondary spacer and prior to the forming of the remainder portion of the source/drain, a trench in the first portion of the source/drain.

9. The method according to claim 4, further comprising:
   removing the dummy gate from the gate stack regions; and
   forming a replacement metal gate in an opening in the gate stack regions resulting from the removing of the dummy gate.

10. A method for forming an epitaxial source/drain in a fin-shaped field effect transistor (FinFET) device, the method comprising:
    etching a trench in a source/drain region of a fin of the FinFET device situated between a first gate stack region and a second gate stack region, each of the first gate stack region and the second gate stack region comprising a primary spacer along a vertical surface;
    forming a first portion of the source/drain in the trench on the fin;
    forming, subsequent to the forming of the first portion of the source/drain, a secondary spacer over the primary spacer on the vertical surface;
    removing the secondary spacer from over the first portion of the source/drain; and
    forming a remainder portion of the source/drain in a portion of the source/drain region adjacent to the secondary spacer.

11. The method according to claim 10, further comprising forming a set of fins from a substrate to form a finned substrate.

12. The method according to claim 11, further comprising:
    forming, prior to the forming of the first portion of the source/drain, the first gate stack region and the second gate stack region on the finned substrate, wherein each of the first and second gate stack regions further comprise a dummy gate.

13. The method according to claim 10, wherein the secondary spacer restricts a growth of the source/drain in a direction of an adjacent source/drain.

14. The method according to claim 10,
    wherein the forming of the first portion of the source/drain further comprises growing a first epitaxial layer on the fin to a pre-determined intermediate size; and
    wherein the forming of the remainder portion of the source/drain further comprises growing a second epitaxial layer on the first epitaxial layer to a final size.

15. The method according to claim 10, wherein the secondary spacer comprises a material that is different from a material of the primary spacer.

16. The method according to claim 12, further comprising:
    removing the dummy gate from the gate stack regions; and
    forming a replacement metal gate in an opening in the gate stack regions resulting from the removing of the dummy gate.

* * * * *